(12) United States Patent
Sakuyama

(10) Patent No.: US 7,926,696 B2
(45) Date of Patent: Apr. 19, 2011

(54) COMPOSITION

(75) Inventor: Seiki Sakuyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/830,784

(22) Filed: Jul. 6, 2010

(65) Prior Publication Data

US 2010/0270362 A1  Oct. 28, 2010

Related U.S. Application Data

(63) Continuation of application No. PCT/JP2008/051116, filed on Jan. 25, 2008.

(51) Int. Cl.
*B23K 31/02* (2006.01)
(52) U.S. Cl. .................. 228/180.21; 228/222
(58) Field of Classification Search .............. None
See application file for complete search history.

(56) References Cited

U.S. PATENT DOCUMENTS

| | | | | |
|---|---|---|---|---|
| 5,411,199 A | * | 5/1995 | Suppelsa et al. | 228/179.1 |
| 5,445,308 A | * | 8/1995 | Nelson et al. | 228/121 |
| 5,448,817 A | * | 9/1995 | Waldsmith | 29/426.5 |
| 6,053,394 A | * | 4/2000 | Dockerty et al. | 228/180.22 |
| 6,660,203 B1 | * | 12/2003 | Fujimoto et al. | 264/171.13 |
| 7,531,387 B1 | * | 5/2009 | Karashima et al. | 438/127 |
| 2002/0143092 A1 | * | 10/2002 | Matayabas, Jr. | 524/439 |
| 2003/0034381 A1 | * | 2/2003 | Nakatsuka et al. | 228/180.1 |
| 2003/0062195 A1 | * | 4/2003 | Arrigotti et al. | 174/260 |
| 2003/0106924 A1 | * | 6/2003 | Nobori et al. | 228/180.22 |
| 2003/0127496 A1 | * | 7/2003 | Tetsuka et al. | 228/180.22 |
| 2005/0082352 A1 | * | 4/2005 | Bolde et al. | 228/264 |
| 2006/0266806 A1 | * | 11/2006 | Yamamoto et al. | 228/214 |
| 2007/0023488 A1 | * | 2/2007 | Lawlyes et al. | 228/180.22 |
| 2008/0166543 A1 | * | 7/2008 | Zhuo | 428/323 |

FOREIGN PATENT DOCUMENTS

JP  63-062333 A  *  3/1988

\* cited by examiner

*Primary Examiner* — Kiley Stoner
(74) *Attorney, Agent, or Firm* — Westerman, Hattori, Daniels & Adrian, LLP

(57) ABSTRACT

A composition for controlling a temperature elevation of an electronic component when soldering the electronic component on a substrate, includes a first resin for providing the composition with adhesion to the electronic component, a curing agent for curing the first resin by heat treatment for soldering, and a second resin for facilitating removal of the composition from the electronic component.

3 Claims, 3 Drawing Sheets

FIG. 2

| | ADHESIVE RESIN, CURING AGENT, INORGANIC FILLER | | | RELEASE RESIN (WT%) | MAXIMUM ATTAINED TEMPERATURE (°C) | COATING PROPERTY | REMOVABILITY |
|---|---|---|---|---|---|---|---|
| | ADHESIVE RESIN, CURING AGENT (wt%) | INORGANIC FILLER (wt%) | TOTAL (wt%) | | | | |
| SAMPLE 1 | 33 | 60 | 93 | 7 | 245 | GOOD | BAD |
| SAMPLE 2 | 30 | 60 | 90 | 10 | 245 | GOOD | GOOD |
| SAMPLE 3 | 25 | 60 | 85 | 15 | 245 | GOOD | GOOD |
| SAMPLE 4 | 17 | 60 | 77 | 23 | 245 | GOOD | GOOD |
| SAMPLE 5 | 8 | 60 | 68 | 32 | 245 | GOOD | GOOD |
| SAMPLE 6 | 5 | 60 | 65 | 35 | 245 | GOOD | GOOD |
| SAMPLE 7 | 4 | 60 | 64 | 36 | 245 | GOOD | BAD |
| SAMPLE 8 | 21 | 30 | 51 | 49 | 250 | BAD | BAD |
| SAMPLE 9 | 18 | 40 | 58 | 42 | 247 | GOOD | GOOD |
| SAMPLE 10 | 15 | 50 | 65 | 35 | 245 | GOOD | GOOD |
| SAMPLE 11 | 13 | 60 | 73 | 27 | 244 | GOOD | GOOD |
| SAMPLE 12 | 6 | 70 | 76 | 24 | 243 | BAD | BAD |
| SAMPLE 13 | 50 | 40 | 90 | 10 | 247 | BAD | BAD |
| SAMPLE 14 | 40 | 50 | 90 | 10 | 245 | GOOD | GOOD |
| SAMPLE 15 | 30 | 60 | 90 | 10 | 244 | GOOD | GOOD |
| SAMPLE 16 | 20 | 70 | 90 | 10 | 243 | GOOD | GOOD |
| SAMPLE 17 | 10 | 80 | 90 | 10 | 243 | BAD | BAD |
| COMPARATIVE EXAMPLE | — | — | — | — | 265 | — | — |

US 7,926,696 B2

COMPOSITION

CROSS-REFERENCE TO RELATED APPLICATION

This is a continuation of International Application No. PCT/JP2008/051116 filed on Jan. 25, 2008, the entire contents of which are incorporated herein by reference.

FIELD

An aspect of the embodiments discussed herein is directed to a composition and a component mounting method.

BACKGROUND

Reflow is widely known as a technique for mounting electronic components on a printed wiring board. In a reflow method, solder paste is applied to electrodes of a printed wiring board by printing through a metal mask, then electronic components are mounted at predetermined positions on the printed wiring board, and all the components are soldered at one time. For soldering, the printed wiring board on which the electronic components have been mounted is heated in a furnace.

Since the reflow method allows components of varying sizes to be bonded at one time, it is superior in productivity and has a great advantage in cost efficiency. In a process using the reflow method, it is desirable not to vary heat capacity among electronic components.

Small components include, for example, chip components, IC's, electric field capacitors. Large components include, for example, QFP's (quad flat packages) and BGA's (ball grid arrays). Small components generally have small heat capacities, and accordingly their temperatures are easily increased. On the other hand, large components generally have large heat capacities, and accordingly their temperatures are not easily increased.

The reflow method uses solder. As the use of lead is reduced, the use of lead-free solder is being spread. In general, lead-free solder has a higher melting point than eutectic solder. Accordingly, the reflow temperature of lead-free solder tends to be high. Reflow temperature is generally set at a temperature 10° C. to 30° C. higher than the melting point of solder so that the solder may melt and achieve bonding in a short time.

In use of a lead-free solder, if the heating temperature is increased to a temperature at which component having large heat capacities may be bonded, components having small capacities are thermally damaged by rapid temperature increase. If the heating temperature is reduced to avoid such thermal damage, however, the joints may not be heated sufficiently to melt, wet and spread the lead-free solder.

In order to prevent the thermal damage of small components, Japanese Laid-open Patent Publication No. 2001-348488 discusses a technique for protecting the components with a compact of a thermally conductive resin composition containing an epoxy resin and an inorganic filler. Unfortunately, the thermally conductive resin composition is used in a state where it is integrated with a component. Accordingly, the volume of the electronic component is undesirably increased after being mounted.

SUMMARY

According to an aspect of an embodiment, a composition for controlling a temperature elevation of an electronic component when soldering the electronic component on a substrate, includes a first resin for providing the composition with adhesion to the electronic component, a curing agent for curing the first resin by heat treatment for soldering, and a second resin for facilitating removal of the composition from the electronic component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 2 is a table of the evaluation results of samples of the temperature control composition according to an embodiment.

DESCRIPTION OF EMBODIMENT

An embodiment will be described with reference to FIGS. 1A to 1D and FIGS. 2 and 3. However, the present technique is not limited to the embodiment.

A component mounting method using a temperature control composition according to an embodiment will first be described in the order of process operations with reference to FIGS. 1A to 1D.

Figure 1A:
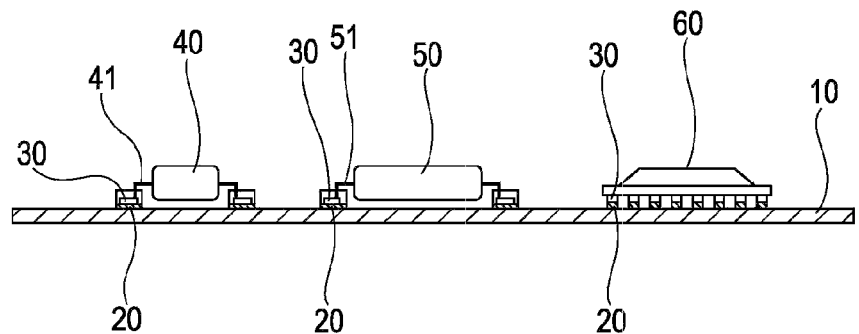
FIGS. 1A to 1D are representations of some operations of a component mounting method using a temperature control composition according to an embodiment.

FIG. 1A illustrates the state where electronic components 40, 50 and 60 are disposed on one surface of a substrate 10. These electronic components 40, 50 and 60 are secured on the substrate 10 with solder paste, as illustrated in FIG. 1A.

The substrate 10 may be made of a glass base-epoxy laminate, a glass-epoxy composite, a glass-bismaleimide-triazine (BT) composite, or an organic insulating resin, such as polyimide. As an alternative to these materials, the substrate 10 may be made of an inorganic material, such as ceramic, glass, or silicon. The material of the substrate 10 is resistant to heat. On the other surface of the substrate 10, conductors 20 made of, for example, copper are provided. The substrate 10 measures, for example, A4 size, and has a thickness of, for example, 0.5 to 5 mm in thickness.

The solder paste 30 is applied between the corresponding conductors 20 and below-described leads 41 of the electronic components 40, between the corresponding conductors 20 and the below-described leads 51 of the electronic component 50, and between the corresponding conductors 20 and electrodes (not illustrated) of the electronic component 60. The solder paste 30 contains lead-free powder essentially composed of Sn-3.0Ag-0.5Cu, and a resin material containing rosin, an activator and a solvent. The reflow temperature in the use of such a solder paste 30 is set at about 240° C. This temperature is about 35° C. higher than the reflow temperature in the use of conventional eutectic solder.

The electronic component 40 is as small as, for example, 3 mm by 3 to 10 mm by 10 mm. The electronic component 40 may be a chip component including an integrated circuit (IC) or an electric field capacitor, for example. The electronic component 40 includes leads 41 as electrodes. The electronic component 40 is disposed on conductors 20 on the surface of the substrate 10 with the leads 41 therebetween.

The electronic component 40 is sheathed with, for example, an epoxy sealant. The sheath of an electric field capacitor may be made of a metal. In the present embodiment, the sheath of the electronic component 40 may be made of glass, aluminum, copper, or iron.

The electronic component 50 is slightly larger than the above-described electronic component 40, and may be a semiconductor component such as a chip size package (CSP). The electronic component 50 includes leads 51 as electrodes. The electronic component 50 is disposed on conductors 20 on the surface of the substrate 10 with the leads 51 therebetween.

The other electronic component 60 is slightly larger than the above-described electronic component 50, and may be a semiconductor component such as a quad flat package (QFP), a plastic ball grid array (PBGA), or a flip chip-ball grid array (FC-BGA). The electronic component 60 has pin-shaped or ball-shaped electrodes (not illustrated) on the bottom of the package. The electronic component 60 is disposed on conductors 20 on the surface of the substrate 10 with the electrodes therebetween.

The electronic component 40 has a smaller heat capacity than the electronic components 50 and 60. Accordingly, when the entire substrate 10 is subjected to reflow mounting, the temperature of the electronic component 40 more rapidly increases than the temperatures of the electronic components 50 and 60, and thus rapidly reaches the upper limit of heat resistance.

Figure 1B:
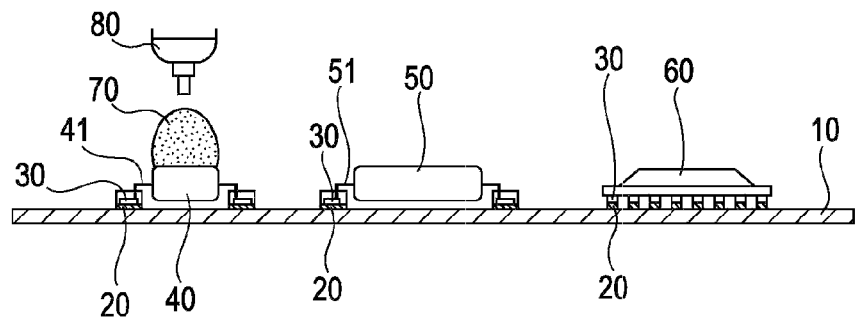

FIG. 1B illustrates the operation of applying a temperature control composition 70 onto one surface of the electronic component 40. In this operation, the temperature control composition 70 is applied to the electronic component 40 with a dispenser 80.

In the present embodiment, the temperature control composition 70 contains: (1) an adhesive resin adhesive to the sheath of the electronic component; (2) a curing agent that cures the adhesive resin by heating; (3) an inorganic filler essentially composed of an inorganic material having a higher specific heat than the adhesive resin, and increasing the heat capacity of the electronic component; and (4) a release resin facilitating the removal of the adhesive resin from the sheath of the electronic component. The adhesive resin mainly contains, for example, bisphenol-F epoxy resin and naphthalene epoxy resin. The curing agent mainly contains, for example, 2,4-diamino-6-[2'-methylmidazolyl-(1')]-ethyl-s-triazine. The inorganic filler may be prepared by forming silica (having an average particle sized of 5 μm) into needles. The release resin mainly contains, for example, a silicone resin. The dispenser 80 contains the temperature control composition 70 therein. The temperature control composition 70 is discharged to the electronic component 40 from the dispenser 80.

For example, 50 g of the temperature control composition 70 is applied to the sheath of the electronic component 40 at an application pressure of 3 kgf, as illustrated in FIG. 1B.

Figure 1C:
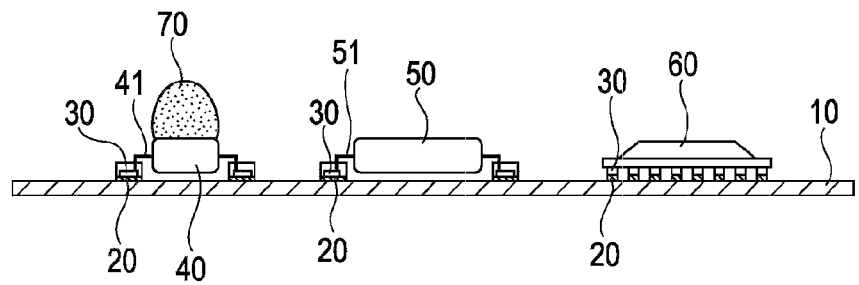

FIG. 1C illustrates the state after the substrate 10 on which the temperature control composition 70 has been applied to the surface of the electronic component 40 is subjected to reflow at one time. As illustrated in FIG. 1C, the substrate 1 is placed in a reflow furnace (not illustrated) to perform reflow of the electronic components 40, 50 and 60 at one time. The solder paste 30 between the leads 41 of the electronic component 40 and the corresponding conductors 20, between the leads 51 of the electronic component 50 and the corresponding conductors 20, and between the electrodes of the electronic component 60 and the corresponding conductors 20 is hardened through this operation. Thus, the leads 41 of the electronic component 40 and the corresponding conductors 20, the leads 51 of the electronic component 50 and the corresponding conductors 20, and the electrodes of the electronic component 60 and the corresponding conductors 20 are electrically connected.

The heat resistance of the electronic component 40 may be higher or lower than that of the electronic components 50 and 60. Suppose the electronic component 40 has the same heat resistance as the electronic components 50 and 60. In this instance, if the electronic components 50 and 60 are heated to a temperature at which they may be soldered, the electronic component 40, which has a smaller heat capacity, is more likely to suffer excessive temperature increase and thus to be thermally damaged. The thermal damage to the electronic component 40 impairs the original functions of the electronic component 40. If the heating temperature is reduced so as to prevent the thermal damage to the electronic component 40 having a smaller heat capacity, the temperature at the joints of the electronic components 50 and 60 having larger heat capacities may not increase to the melting point of the solder paste 30. Consequently, the electronic components 50 and 60 may not be soldered. Accordingly, when reflow is performed on the electronic components 40, 50 and 60 at one time, the electronic component 40 is heated under conditions suitable for the electronic components 50 and 60 having larger heat capacities.

During the reflow performed at one time, the temperature control composition 70 on the surface of the electronic component 40 is cured. The temperature around the substrate 10 is increased by heating. When the temperature control composition 70 is heated to a temperature of, for example, 200° C. or more, the temperature control composition 70 is cured. This temperature 200° C. is higher than the soldering temperature. The reason why the temperature control composition 70 is cured at the time when its temperature has risen to 200° C. or more is that microencapsulated curing agent is diffused in the temperature control composition 70 at 200° C. to cure the temperature control composition 70. Since the temperature control composition 70 temporarily increases the heat capacity of the electronic component 40, the temperature increase of the electronic component 40 may be prevented.

Figure 1D:
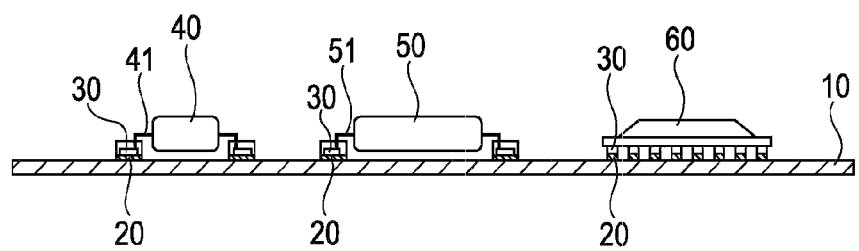

FIG. 1D illustrates the operation of removing the temperature control composition 70 from the electronic component 40 after the heat treatment. A load of, for example, 100 gf to 1.0 kgf is applied to the temperature control composition 70 in the direction substantially parallel to the surface of the substrate 10 with a tool. The release resin in the temperature control composition 70 facilitates easy removal of the temperature control composition 70 after reflow. In order to function properly, preferably, the temperature control composition 70 contains 65% to 90% by weight of an adhesive resin, a curing agent and an inorganic filler. In addition, the temperature control composition 70 preferably further contains 10% to 35% by weight of a release resin. The presence of the release resin in such a proportion in the temperature control composition 70 allows the temperature control composition 70 to be removed from the electronic component 40 without leaving residue.

FIG. 2 illustrates the evaluation results of the coating property and removability of temperature control composition samples 1 to 17 in one-time reflow. The table of FIG. 2 illustrates the evaluation results according to the compositions (contents of adhesive resin, curing agent, inorganic filler and release resin) of the samples, and, in addition, the maximum attained temperature of the electronic component 40.

The total content of the constituents (adhesive resin, curing agent, inorganic filler and release resin) in each sample is 100% by weight.

Sample 1 of the temperature control composition 70 contains 33% by weight of adhesive resin and curing agent, 60% by weight of inorganic filler, and 7% by weight of release resin. Sample 2 of the temperature control composition 70 contains 30% by weight of adhesive resin and curing agent, 60% by weight of inorganic filler, and 10% by weight of release resin. Sample 3 of the temperature control composition 70 contains 25% by weight of adhesive resin and curing agent, 60% by weight of inorganic filler, and 15% by weight of release resin. Sample 4 of the temperature control composition 70 contains 17% by weight of adhesive resin and curing agent, 60% by weight of inorganic filler, and 23% by weight of release resin. Sample 5 of the temperature control composition 70 contains 8% by weight of adhesive resin and curing agent, 60% by weight of inorganic filler, and 32% by weight of release resin. Sample 6 of the temperature control composition 70 contains 5% by weight of adhesive resin and curing agent, 60% by weight of inorganic filler, and 35% by weight of release resin. Sample 7 of the temperature control composition 70 contains 4% by weight of adhesive resin and curing agent, 60% by weight of inorganic filler, and 36% by weight of release resin.

The maximum attained temperature was obtained by measuring the changes in temperature during heat treatment with a thermocouple (not illustrated) disposed between the temperature control composition temperature control composition 70 and the electronic component 40. The results of the comparative example were obtained by measuring the temperature changes of the electronic components 40 to which the temperature control composition 70 was not applied.

For the evaluation of FIG. 2, the temperature control composition 70 was applied to the electronic component 40 measuring 3 mm by 3 mm, and the electronic component 40 was heated for reflow.

The coating property was evaluated by the amount of spread of the temperature control composition 70 applied to the electronic component 40 of 4 mm by 4 mm. More specifically, the temperature control composition 70 was applied to the electronic component 40 of 4 mm by 4 mm from a dispenser 80 having an aperture of 2 mm in diameter at a pressure of 3 kgf. When the temperature control composition 70 did not spread over the entirety of a rectangular area of 3 mm by 3 mm on the surface of the electronic component 40, the coating property was determined to be good. When the temperature control composition 70 spread over the entirety of the rectangular area, the coating property was determined to be bad.

The removability was evaluated by applying a load of, for example, 100 gf to 1.0 kgf to the side of the cured temperature control composition 70 in the direction substantially parallel to the surface of the substrate 10 with a tool. It was confirmed that the temperature control composition 70 may be removed from the electronic component 40 without leaving residue. When the temperature control composition 70 was removed from the electronic component 40 without leaving residue, the removability was determined to be good. In other cases, for example, when the temperature control composition 70 could not be removed from the electronic component 40, or when residue was left on the electronic component 40, the removability was determined to be bad. When a temperature control composition 70 satisfies the criterion for good removability, the temperature control composition 70 is determined to be releasable from electronic components.

As illustrated in the table of FIG. 2, the maximum attained temperature of Samples 1 to 7 was 245° C. The maximum attained temperature of the comparative example was 265° C. This illustrates that Samples 1 to 7 may reduce the maximum attained temperature of the electronic component 40 by about 20° C. from that in the comparative example under the same conditions. The coating properties of Samples 1 to 7 were all good. As for the removability, only Samples 2 to 6 were good. It has been confirmed that Samples 1 to 7 of the temperature control composition 70 may control the heat capacity of electronic components having a small heat capacity while maintaining the coating property and removability.

Sample 8 of the temperature control composition 70 contains 21% by weight of adhesive resin and curing agent, 30% by weight of inorganic filler, and 49% by weight of release resin. Sample 9 of the temperature control composition 70 contains 18% by weight of adhesive resin and curing agent, 40% by weight of inorganic filler, and 42% by weight of release resin. Sample 10 of the temperature control composition 70 contains 15% by weight of adhesive resin and curing agent, 50% by weight of inorganic filler, and 35% by weight of release resin. Sample 11 of the temperature control composition 70 contains 13% by weight of adhesive resin and curing agent, 60% by weight of inorganic filler, and 27% by weight of release resin. Sample 12 of the temperature control composition 70 contains 6% by weight of adhesive resin and curing agent, 70% by weight of inorganic filler, and 24% by weight of release resin. The maximum attained temperature, the coating property and the removability were measured and evaluated under the same conditions as those of Samples 1 to 7.

As illustrated in the table of FIG. 2, the maximum attained temperature of Sample 8 was 250° C. The maximum attained temperature of Sample 9 was 247° C. The maximum attained temperature of Sample 10 was 245° C. The maximum attained temperature of Sample 11 was 244° C. The maximum attained temperature of Sample 12 was 243° C. These results illustrate that Samples 8 to 11 may reduce the maximum attained temperature of the electronic component 40 to be about 10 to 22° C. lower than that in the comparative example under the same conditions. Only Samples 9, 10 and 11 exhibited good coating properties. As for the removability, only Samples 9, 10 and 11 were good. It has been confirmed that Samples 9 to 11 of the temperature control composition 70 may control the heat capacity of electronic components having small heat capacities while maintaining the coating property and removability.

Sample 13 of the temperature control composition 70 contains 50% by weight of adhesive resin and curing agent, 40% by weight of inorganic filler, and 10% by weight of release resin. Sample 14 of the temperature control composition 70 contains 40% by weight of adhesive resin and curing agent, 50% by weight of inorganic filler, and 10% by weight of release resin. Sample 15 of the temperature control composition 70 contains 30% by weight of adhesive resin and curing agent, 60% by weight of inorganic filler, and 10% by weight of release resin. Sample 16 of the temperature control composition 70 contains 20% by weight of adhesive resin and curing agent, 70% by weight of inorganic filler, and 10% by weight of release resin. Sample 17 of the temperature control composition 70 contains 10% by weight of adhesive resin and curing agent, 80% by weight of inorganic filler, and 10% by weight of release resin. The maximum attained temperature, the coating property and the removability were measured and evaluated under the same conditions as those of Samples 1 to 7.

As illustrated in the table of FIG. 2, the maximum attained temperature of Sample 13 was 247° C. The maximum attained temperature of Sample 14 was 245° C. The maximum attained temperature of Sample 15 was 244° C. The maximum attained temperature of Samples 16 and 17 was 243° C. The maximum attained temperature of the comparative example was 265° C. These results illustrate that Samples 13 to 17 may reduce the maximum attained temperature of the electronic component 40 to be about 18 to 22° C. lower than that in the comparative example under the same conditions. Only Samples 14 to 16 exhibited good coating properties. As for the removability, only Samples 14 to 16 were good. It has been confirmed that Samples 14 to 16 of the temperature control composition 70 may control the heat capacity of electronic components having small heat capacities while maintaining the coating property and removability.

The electronic component 40 is sheathed with a sealant made of epoxy or the like. The sheath of an electric field capacitor may be made of a metal. It has been confirmed that the temperature control composition 70 may be removed as well even from electronic component 40 sheathed with a sealant of glass, aluminum, copper or iron. In other words, it has been illustrated that the temperature control composition 70 may be removed from the electronic component 40 without leaving residue, as long as the electronic component 40 is sheathed with epoxy, glass or metal.

Figure 3:
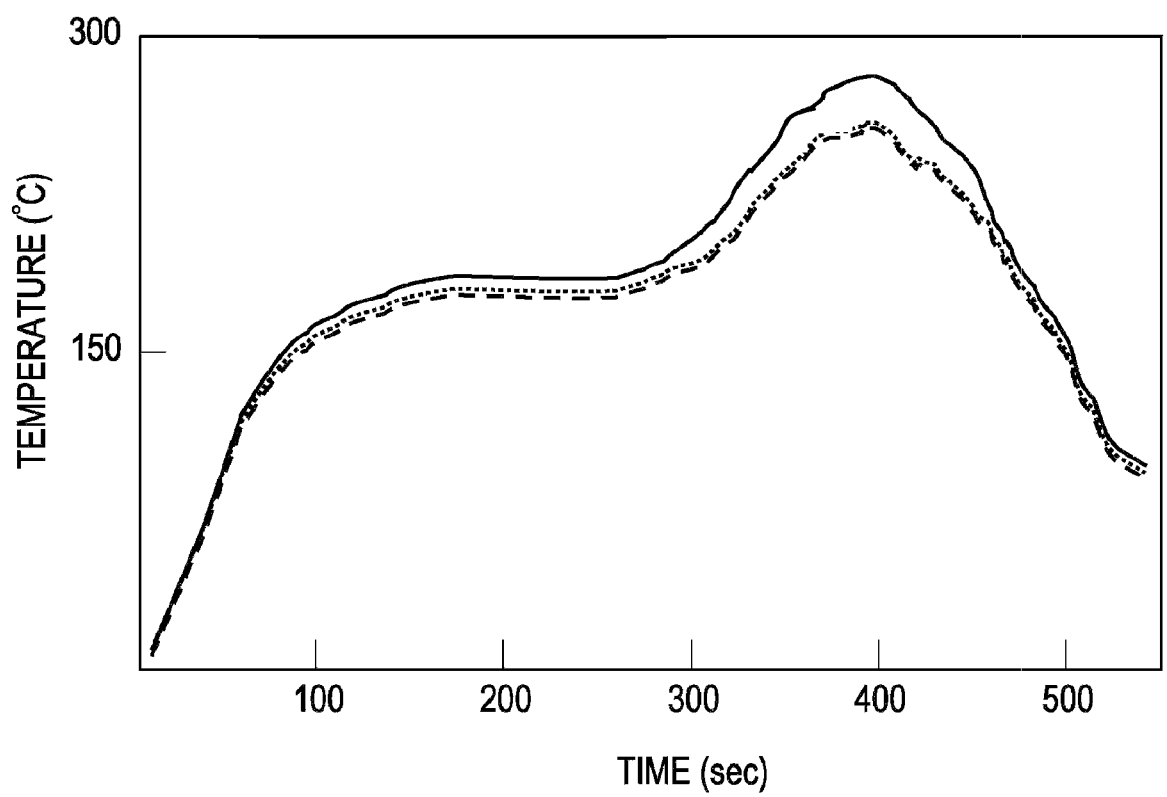
FIG. 3 is a plot of the temperature histories of an electronic component mounted by a component mounting method using samples of the temperature control composition according to an embodiment.

FIG. 3 is a plot of the temperature histories of an electronic component in an electronic component mounting method using samples of the temperature control composition 70. FIG. 3 illustrates temperature histories of the electronic component 40 described with reference to FIG. 1C. More specifically, FIG. 3 illustrates the temperature histories of the electronic component 40 on which the temperature control composition 70 has been applied, in the operation of performing reflow on the substrate 10. The vertical axis of the figure represents the temperature of the electronic component 40 measured with a thermocouple (not illustrated). The lateral axis represents the elapsed time of the reflow operation. In the reflow operation, preheating is performed between elapsed times of 100 seconds to 280 seconds; reflow is performed between elapsed times of 330 seconds to 430 seconds; and cooling is performed between elapsed times of 430 seconds to 530 seconds. The solid line represents the temperature history in the comparative example. As representatives, the temperature histories in use of Samples 4 and 11 are illustrated. The dotted line represents the temperature history in use of Sample 4. The broken line represents the temperature history in use of Sample 11.

As a result of the measurement, the maximum attained temperature of the electronic component 40 in the comparative example was 265° C., as illustrated in FIG. 3. On the other hand, the maximum attained temperature of the electronic component 40 on which Sample 4 was applied was 245° C. Also, the maximum attained temperature of the electronic component 40 on which Sample 11 was applied was 244° C. The temperature histories in FIG. 3 suggest that the temperature control composition 70 may control the maximum attained temperature of the electronic component 40 to a temperature about 20° C. lower than that of the electronic component 40 heated under the same conditions in the comparative example.

The temperature control composition 70 according to the present embodiment temporarily increases the heat capacity of an electronic component by being applied to the electronic component. In addition, the temperature control composition 70 applied may easily be removed with a tool. For example, the temperature control composition 70 may be removed from the electronic component 40 by applying a load of, for example, 100 gf to 1.0 kgf to the side of the cured temperature control composition 70 in the direction substantially parallel to the surface of the substrate 10. Accordingly, the use of the temperature control composition 70 may prevent an electronic component 40 having a smaller heat capacity from being damaged by heat of reflow for mounting electronic components having different heat capacities on a substrate 10. Since the temperature control composition 70 may be removed from the electronic component 40 after reflow, the electronic component 40 may be prevented from being damaged by heat of reflow without increasing its volume.

The surface of the electronic component 40 on which the temperature control composition 70 is to be applied may be made of epoxy, glass, or meal. The temperature control composition 70 applied to such a surface may be removed without leaving residue.

When electronic components having different heat capacities are mounted on a substrate, the component mounting method according to embodiments allows electronic components having larger heat capacities to be mounted reliably while an electronic component having a smaller heat capacity is prevented from being degraded by excessive temperature increase.

The adhesive resin may be mainly composed of an epoxy material or a phenol material. More specifically, examples of the epoxy or phenol material include bisphenol A epoxy, bisphenol F epoxy, naphthalene epoxy, biphenyl epoxy, brominated epoxy, phenol novolak epoxy, and cresol novolak epoxy. These adhesive resins have high viscosities, and, accordingly, may impart adhesion to the temperature control composition.

Examples of the curing agent include 2-phenyl-4-methylimidazole, 2-undecylimidazole, 2,4-diamino-6-[2-methylimidazole-(1)]-ethyl-S-triazine, 1-cyanoethyl-2-ethyl-4-methylimidazole, 1-cyanoethyl-2-undecylimidazole, 2-phenyl-4-methyl-5-hydroxymethylimidazole, and 2-phenyl-4,5-dihydroxymethylimidazole. If any of these curing agents is added to the adhesive resin and the mixture is heated to 200° C. to 230° C., the adhesive resin may be cured rapidly in 5 seconds to 30 seconds.

Preferably, 9% to 29% by weight of the curing agent is added. For example, 9% by weight of the curing agent may be added to 91% by weight of the epoxy resin, or 29% by weight of the curing agent may be added to 71% by weight of the epoxy resin. It is preferable that the proportion of the curing agent and the epoxy resin be controlled such that the amount of the epoxy resin is in the range of 91% to 71% by weight while the amount of the curing agent is in the range of 9% to 29% by weight. The temperature control composition containing the epoxy resin and the curing agent in such a proportion may be cured in a short time, and whose viscosity may be prevented from increasing. In the present embodiment, the curing agent is microencapsulated. The microcapsule of the curing agent may be made of, for example, a polyurethane material. By microencapsulating the curing agent, the adhesive resin may be controlled so as to be cured at a predetermined temperature or more without being cured at low temperatures. Polyurethane materials have melting points of about 200° C. to 230° C. Accordingly, the temperature control composition is not cured at about 200° C. or less, but is cured when the temperature has reached 200° C. or more. At this time, the microcapsules are uniformly dispersed in the temperature control composition, so that the temperature control composition may be cured in a short time. For example, it may be cured at a heating temperature of 200° C. to 230° C. in 30 seconds or less.

Particles of the adhesive resin and the release resin are present around the microcapsules. The particles of the adhesive resin are, for example, an epoxy resin. Once the microcapsules are broken, the curing agent in the microcapsules and the epoxy resin are mixed to cause a chemical endothermic reaction. The endothermic reaction absorbs heat from the surface of the electronic component on which the temperature control composition is disposed, and consequently, the heat capacity of the temperature control composition is temporarily increased.

The inorganic filler will now be described. Preferably, the inorganic filler, which is intended to increase the heat capacity, mainly contains an inorganic material having a higher specific heat than the adhesive resin. Examples of the inorganic material include non-conductive metal oxides, such as alumina, silica, chromia, and titania, aluminium nitride, and silicon nitride. Since the inorganic filler is made of such an inorganic material, the heat capacity may further be increased.

The release resin will now be described. Silicone resin may be used as the release resin, which is intended to facilitate the removal of the temperature control composition from the sheath of the electronic component (intended to impart a removability). Silicone has a low surface tension. By adding a silicone resin in the temperature control composition, the removability of the temperature control composition may be increased. The silicone resin may be arbitrarily selected from commercially available silicone materials.

The removability from the electronic component may be evaluated by applying a load to the side of the cured temperature control composition in the direction substantially parallel to the surface of the substrate 10. For example, a load of 100 gf to 1.0 kgf is applied to the temperature control composition using a tool. If the temperature control composition has a high removability from the electronic component, the temperature control composition may be removed without leaving residue on the surface of the electronic component.

By applying the temperature control composition to an electronic component, the heat capacity of the electronic component may temporarily increased. In particular, by applying the temperature control composition to a small electronic component, whose temperature is generally easy to increase, the temperature control composition reliably prevents the temperature of the small electronic component from increasing, and thus prevents the electronic component from being damaged by the temperature increase.

The temperature control composition according to the present embodiment contains an adhesive resin that may be cured by heating for reflow and a release resin facilitating the removal of the temperature control composition after reflow. The temperature control composition further contains an inorganic filler having a higher specific heat than the adhesive resin. By adding the inorganic filler, the heat capacity of the temperature control composition may further be increased.

By optimizing the proportion of the release resin and the mixture of the adhesive resin, the curing agent and the inorganic filler, the temperature control composition may be prevented from being deformed to flow down during heating. Preferably, for example, the temperature control composition contains 65% to 90% by weight of mixture of adhesive resin, curing agent and inorganic filler, and 10% to 35% by weight of release resin. A temperature control composition containing 90% by weight or more of mixture of adhesive resin, curing agent and inorganic filler and 10% by weight or less of release resin may have so high an adhesion to electronic components as not to be easily removed after reflow (heating). In contrast, a temperature control composition containing 64% by weight or less of mixture of adhesive resin, curing agent and inorganic filler and 46% by weight or more of release resin may not be sufficiently cured, and may leave residue after being removed.

Preferably, the temperature control composition contains 5% to 30% by weight of adhesive resin containing a curing agent, 60% by weight of inorganic filler, and 10% to 35% by weight of release resin. Alternatively, the temperature control composition may contain 13% to 18% by weight of adhesive resin containing a curing agent, 40% to 60% by weight of inorganic filler, and 27 to 42% by weight of release resin. Also, the temperature control composition may contain 20% to 40% by weight of adhesive resin containing a curing agent, 50% to 70% by weight of inorganic filler, and 10% by weight of release resin.

If the temperature control composition contains 60% by weight of inorganic filler and less than 5% by weight of adhesive resin containing a curing agent, the viscosity of the temperature control composition may increase to the extent that it may not be applied using a dispenser. In contrast, if the temperature control composition contains 60% by weight of inorganic filler and more than 30% by weight of adhesive resin containing a curing agent, the temperature control composition may not have a sufficient heat capacity.

If the temperature control composition contains less than 13% by weight of adhesive resin containing a curing agent and more than 60% by weight of inorganic filler, the viscosity of the temperature control composition may increase to the extent that it may not be applied using a dispenser. In contrast, if the temperature control composition contains more than 18% by weight of adhesive resin containing a curing agent and less than 40% by weight of inorganic filler, the temperature control composition may not have a sufficient heat capacity.

If the temperature control composition contains less than 20% by weight of adhesive resin containing a curing agent and more than 70% by weight of inorganic filler, the viscosity of the temperature control composition may increase to the extent that it may not be applied using a dispenser. In contrast, if the temperature control composition contains more than 40% by weight of adhesive resin containing a curing agent and less than 50% by weight of inorganic filler, the temperature control composition may not have a sufficient heat capacity.

The temperature control composition according to the present embodiment may be used in a reflow operation for mounting electronic components having different heat capacities on a substrate 10.

The temperature control composition temporarily increases the heat capacity of an electronic component by being applied to the electronic component. Consequently, the use of the temperature control composition may prevent an electronic component having a smaller heat capacity from being damaged by heat in a reflow operation.

The temperature control composition according to the present embodiment may be used in a soldering operation performed in a flow bath. Also, the temperature control composition may be used in the repair operation of removing electronic components mounted on a substrate and remounting them.

Lead-free solder has a high melting point. If the temperature control composition according to the present embodiment is applied to a substrate using a lead-free solder, thermal damage to electronic components having smaller heat capacities may be prevented effectively.

All examples and conditional language recited herein are intended for pedagogical purposes to aid the reader in understanding the embodiment and the concepts contributed by the inventor to furthering the art, and are to be construed as being without limitation to such specifically recited examples and conditions, nor does the organization of such examples in the specification relate to a illustrating of the superiority and inferiority of the embodiment. Although the embodiment has been described in detail, it should be understood that the various changes, substitutions, and alterations could be made hereto without departing from the spirit and scope of the invention.

What is claimed is:

1. A component mounting method comprising:
  placing an electronic component on a substrate, the electronic component including a sheath and an electrode;
  disposing a temperature control composition for controlling a temperature on the electronic component, the temperature control composition including a first resin for providing the temperature control composition with adhesion to the electronic component, a curing agent for curing the first resin by heat treatment for soldering, and a second resin for facilitating removal of the first resin from the electronic component;
  performing heat treatment of the substrate for soldering so as to securely mount the electronic component on the substrate; and
  removing the temperature control composition disposed on the electronic component after performing the heat treatment.

2. The component mounting method according to claim 1, wherein the temperature control composition further comprises an inorganic filler made of an inorganic material having a greater specific heat than that of the first resin.

3. The component mounting method according to claim 1, wherein the sheath of the electronic component is made of an epoxy resin, a glass or a metal material.

* * * * *